United States Patent
Hoff et al.

(10) Patent No.: US 9,640,250 B1
(45) Date of Patent: May 2, 2017

(54) EFFICIENT COMPARE OPERATION

(71) Applicant: QUALCOMM Incorporated, San Diego, CA (US)

(72) Inventors: David Paul Hoff, Raleigh, NC (US); Stephen Edward Liles, Apex, NC (US); Brian Joy Reed, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/155,076

(22) Filed: May 16, 2016

(51) Int. Cl.
- G11C 15/00 (2006.01)
- G11C 11/419 (2006.01)
- G11C 15/04 (2006.01)

(52) U.S. Cl.
CPC ............ *G11C 11/419* (2013.01); *G11C 15/00* (2013.01); *G11C 15/046* (2013.01)

(58) Field of Classification Search
CPC .......................................... G11C 15/00–15/06
USPC ..................... 365/49.1, 49.11, 154
See application file for complete search history.

(56) References Cited

U.S. PATENT DOCUMENTS

| | | | |
|---|---|---|---|
| 5,391,938 A | 2/1995 | Hatsuda | |
| 2001/0026464 A1* | 10/2001 | Hata | G11C 15/04 365/49.1 |
| 2013/0326111 A1* | 12/2013 | Arsovski | G11C 15/04 711/102 |
| 2015/0078103 A1 | 3/2015 | Roy | |
| 2015/0170726 A1 | 6/2015 | Antonyan | |
| 2015/0235703 A1* | 8/2015 | Sakimura | G11C 15/04 365/49.17 |
| 2015/0357019 A1 | 12/2015 | Wheeler et al. | |

* cited by examiner

*Primary Examiner* — Han Yang
(74) *Attorney, Agent, or Firm* — Muncy, Geissler, Olds & Lowe, P.C.

(57) ABSTRACT

Systems and methods relate to memory operations in a memory array. A compare operation is performed using a sense amplifier. True and complement versions of a search bit are compared with true and complement versions of a data bit stored in a data row of the memory array to generate true and complement sense amplifier inputs. The true and complement sense amplifier inputs are amplified in the sense amplifier to generate a single-ended match signal. The single-ended match signal can be aggregated with other single-ended match signals in the data row to determine whether there is a hit or miss for a compare operation on the entire data row.

17 Claims, 5 Drawing Sheets

EFFICIENT COMPARE OPERATION

FIELD OF DISCLOSURE

Disclosed aspects pertain to processing systems comprising memory. More specifically, exemplary aspects are directed to reducing delays and complexity in memory operations involving compare operations.

BACKGROUND

Processing systems include memory systems configured to store data, instructions, etc. A memory, such as a cache associated with a processor, may include a data array, for example. For an access operation (e.g., read/write), the data array may be accessed and a search may be performed to determine whether any line of the data array holds the data desired by the processor. The data may be organized in a variety of ways known in the art (e.g., direct mapped, set associative, etc.).

Searching for desired data in the cache may involve obtaining an index from an access address (e.g., one or more bits of the address associated with the access operation) and searching a location in the cache corresponding to the index to determine if the cache holds data corresponding to the address. For example, a tag array may hold tags comprising at least a portion of the addresses corresponding to data stored therein and searching the cache may involve comparing (e.g., for a bitwise match) bits of the access address and the tag at the indexed location. If there is a match, then a cache hit is determined and data may be read out from the indexed location.

The bitwise comparisons for determining whether there is a match can involve reading out the bits of the tag (or, more generally, a stored line), and then comparing each bit read out with a corresponding bit of the access address (or, more generally, a search word). The results of the bitwise comparisons, i.e., match or mismatch, for each bit may then be aggregated with the results of the comparisons across all the bits to determine the overall hit/miss or match/mismatch indication of the search word with the stored line.

In conventional memory access operations which involve a search, the above-mentioned steps, i.e., a bitwise read, followed by a bitwise compare, followed by aggregation across a plurality of all bits of the stored line, are serialized. Therefore the search can involve significant delays. With ever increasing demands for high performance computing, there is a need for improved memory access speeds, and a corresponding need for reducing the delays involved in the conventional search operations.

SUMMARY

Exemplary embodiments of the invention are directed to systems and methods pertaining to memory operations in a memory array. A compare operation is performed using a sense amplifier. True and complement versions of a search bit are compared with true and complement versions of a data bit stored in a data row of the memory array to generate true and complement sense amplifier inputs. The true and complement sense amplifier inputs are amplified in the sense amplifier to generate a single-ended match signal. The single-ended match signal can be aggregated with two or more other single-ended match signals in the data row to determine whether there is a hit or miss for a compare operation on the entire data row.

For example, an exemplary aspect is directed to a method of performing memory operations in a memory array, the method comprising comparing true and complement versions of a first search bit with true and complement versions of a first data bit stored in a data row of the memory array to generate true and complement sense amplifier inputs, and amplifying the true and complement sense amplifier inputs in a sense amplifier to generate a first single-ended match signal.

Another exemplary aspect is directed to an apparatus comprising logic configured to compare true and complement versions of a first search bit with true and complement versions of a first data bit stored in a data row of a memory array to generate true and complement sense amplifier inputs, and a sense amplifier configured to amplify the true and complement sense amplifier inputs to generate a first single-ended match signal.

Yet another exemplary aspect is directed to an apparatus comprising means for comparing true and complement versions of a first search bit with true and complement versions of a first data bit stored in a data row of a memory array to generate true and complement inputs, and means for amplifying the true and complement inputs for generating a first single-ended match signal.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1A:
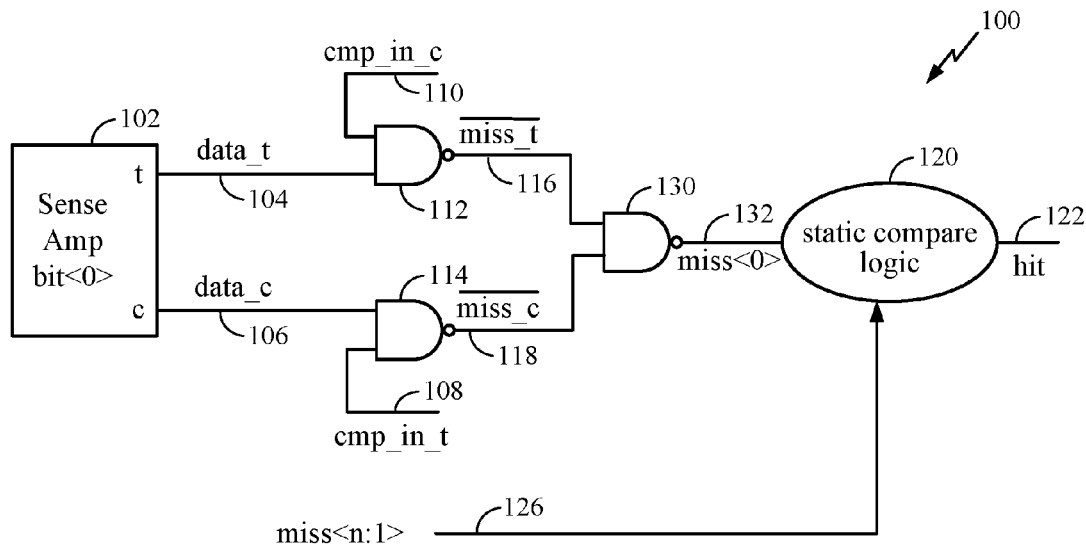
FIGS. 1A-B illustrate implementations of conventional compare circuits.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary aspects of this disclosure are directed to efficient memory access operations. More specifically, exemplary aspects involve reducing the delays associated with search operations, for example, by reducing the steps and accompanying logic and delays involved therein. To explain exemplary aspects, an example memory array comprising standard static random access memory (SRAM) constructed in a well-known six transistor (6T) configuration is considered (keeping in mind that other known configurations of bit cells, such as 8T, 10T, etc. are also possible without deviating from the scope of this disclosure).

As known in the art, for reading a data bit stored in an SRAM bit cell, a sense amplifier may be used to amplify true and complement values read out for the data bit stored. In exemplary aspects, the speed of a search operation, e.g., involving a comparison of the data bit with a search input, is improved by first comparing the true and complement values of the data bit with true and complement values of the search input and then amplifying the result of the comparison in the sense amplifier. Accordingly, the output of the sense amplifier provides an indication of whether there was a match or mismatch between the search input and the data bit. By aggregating the match outputs from all sense amplifiers in a row of the memory array, a hit/miss indication for comparing a search word comprising two or more search bits with corresponding two or more data bits of the row can be obtained.

As such, in an exemplary search operation, the read operation is not completed (e.g., amplification of read data by a sense amplifier is not started) before a compare operation is started. Rather, the comparison is performed before the sense amplification stage and the comparison is provided to the sense amplifier, which allows for the output of the sense amplifier to directly provide a match/mismatch indication for each bit searched. These and other exemplary aspects will be described in the following sections.

Firstly with reference to FIGS. 1A-B, conventional compare operations will be explained. More specifically, FIG. 1A illustrates a schematic representation of a first conventional compare circuit, designated as compare circuit 100.

Compare circuit 100 may be provided for searching an indexed location of a memory array (not shown), e.g., for determining if there is a bitwise match between n-bits of a search word and n-bits of a data row at the indexed location. Considering a single data bit, e.g., bit[0] of the data row, bit[0] may be stored in a standard SRAM bit cell (not shown), for example, implemented as a six transistor (6T) SRAM bit cell configuration. Reading bit[0] involves reading out true and complement branches of the 6T SRAM bit cell and using a sense amplifier to magnify the difference between the true and complement branches to generate stable true and complement values. As shown, sense amplifier 102 can be used to generate data_t 104 and data_c 106 corresponding to true and complement values of the value stored in bit[0].

True and complement values of a corresponding search bit of the search word are shown as inputs cmp_in_t 108 and cmp_in_c 110, respectively, which may be dynamic signals (e.g., active-low signals). The search bit is compared with bit[0], for example, by using an XOR function or XOR logic implemented using NAND gate 112 to NAND the complement value of the search bit, cmp_in_c 110 with true value of bit[0], data_t 104 and NAND gate 114 to NAND the true value of the search bit, cmp_in_t 108 with the the complement value of bit[0], data_c 106, and performing a NAND of the output of NAND gates 112 and 114 in NAND gate 130. The output of NAND gate 112 is shown as an inverted value of miss_t 116, which is low if cmp_in_c 110 and data_t 104 are both high, and high otherwise. The output of NAND gate 114 is shown as an inverted value of miss_c 118, which is low if cmp_in_t 108 and data_c 106 are both high, and high otherwise. The output NAND gate 130 (which, as previously mentioned is the NAND of the outputs of NAND gates 112 and 114) provides the miss indication for the comparison between the search bit and bit[0], shown as miss[0] 132. Miss [0] 132 is high if at most one of the outputs of NAND gates 112 and 114 is high, and otherwise low. Accordingly, miss [0] 132 is high if there is a mismatch between the search bit and bit[0]. Similarly, miss indications are obtained for the remaining n−1 bits, as shown by the bus miss [n:1] 126 in FIG. 1A. The miss indications for all n-bits are then aggregated in the logic block shown as static compare logic 120 (e.g., implementing an n-bit NAND function of the miss indications for all n bits, miss [n:0]) to determine overall hit 122 as the output of compare circuit 100 (e.g., hit 122, which is also a dynamic signal, e.g., an active-high signal, will be high if miss indications for all n-bits, miss [n:0] are low).

Accordingly, with the static compare logic 120 implementation, compare circuit 100 involves the three serial stages of, first: generating data_t 104 and data_c 106 from the output of sense amplifier 102, second: determining miss[0] 132 based on a comparison of bit[0] with the search bit, e.g., by using NANG gates 112, 114, and 130 as described above, and third: aggregating miss[0] 132 with miss [n:1] 126 in static compare logic 120 to generate hit 122.

Figure 1B:
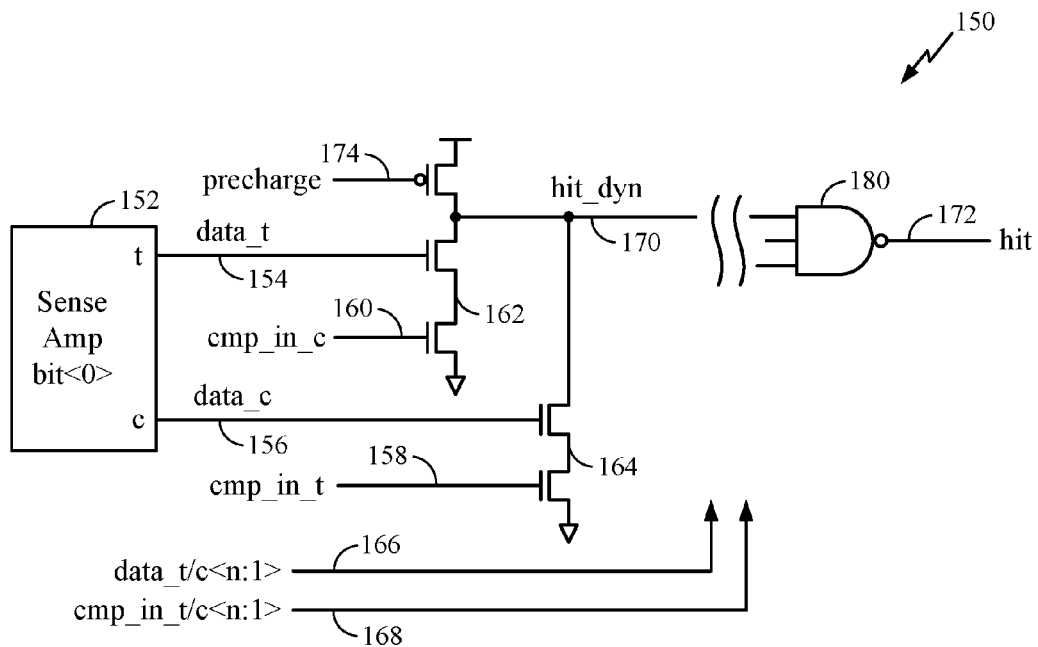

FIG. 1B illustrates a schematic representation of a second conventional compare circuit, designated as compare circuit 150. Compare circuit 150 may be used to obtain the same result as compare circuit 100 of FIG. 1A, but with minor differences in implementation, as will be discussed in the following sections. Similar to compare circuit 100, compare circuit 150 also involves three stages, wherein in a first stage, sense amplifier 152, provides true and complement outputs data_t 154 and data_c 156 corresponding to a read operation of data bit[0] in a row of a memory array (not shown). In a second stage, true and complement versions of a search bit, cmp_in_t 158 and cmp_in_c 160 are provided to n-channel field effect transistor (NFET) pull-down stacks 164 and 162, respectively (it is noted that each of pull-down stacks 162 and 164 include 2 NFETs in series, wherein one NFET's gate is controlled by data_t 154/data_c 156 and one NFET's gate is controlled by cmp_in_c 160/cmp_in_t 158 respectively, to implement an XOR function or comparison function in dynamic logic). The signal, hit_dynamic 170 is initially precharged to a high state by precharge or pull-up transistor 174 during a precharge phase, and once the precharge phase is over, pull-up transistor 174 is turned off and the output signal hit_dynamic 170 falls if there is a miss or mismatch between the search bit and bit[0] or otherwise, hit_dynamic 170 stays high if there is a hit or match. Similarly, true and complement data signals from remaining n−1 bits of the data word, collectively shown as data_t/c[n:1] 166 and corresponding n−1 true and complement search bits, collectively shown as cmp_in_t/c[n:1] 168 are compared using NFETs or pull-down stacks (not shown) and the hit_dynamic signals from all n-bits are aggregated in NAND gate 180 in a third stage to generate hit 172. Accordingly, the dynamic logic implementation of aggregating comparisons across all n-bits to generate hit 172 in compare circuit 150 also involves three stages as described above.

In exemplary aspects of this disclosure, the number of stages involved in a comparison operation is collapsed. More specifically, processes for reading data stored in memory and comparing the data to search data may be implemented within a single stage to provide a comparison, which can be amplified by a sense amplifier, such that in the case of a comparison, the sense amplifier output directly provides the result of the comparison. For example, for a single bit comparison, a search bit is used as a control to select either the true or the complement version of a data bit. The selection amplified by the sense amplifier, such that the output of the sense amplifier indicates there was a match or a mismatch between the data bit and the search bit. Furthermore, even though the sense amplifier can output true and complement versions of the result of the comparison (e.g., a match output and its complement, a mismatch output) only a single-ended output of the sense amplifier may be used for aggregation across all bits searched in some aspects. The use of single-ended outputs from the sense amplifiers simplifies the aggregation logic for determining in the overall hit/miss determination for an n-bit data word. Implementations of the exemplary comparison circuits using static and dynamic logic will now be explained in the following sections.

Figure 2A:
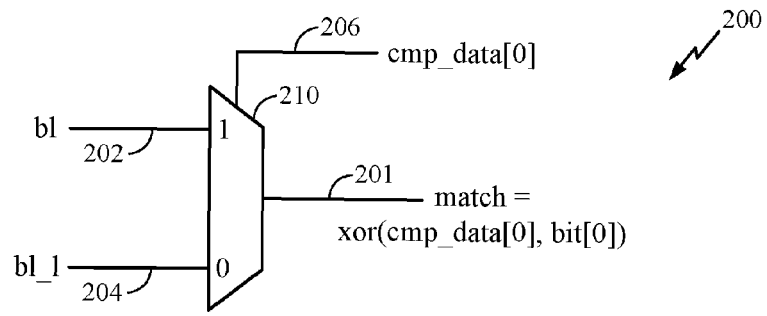
FIGS. 2A-B illustrate implementations of single-bit compare circuits according to exemplary aspects of this disclosure.

Firstly, with reference to FIG. 2A, circuit 200 is illustrated to show the functionality implemented in exemplary single-bit compare operations. The signals b1 202 and b1_1 204 may be true and complement versions of the value of a data bit, e.g., bit[0] stored in a data row. The signal shown as cmp_data[0] 206 may represent the value of a corresponding bit of a search word (referred to as cmp_data) to be compared with bit[0] (true and complement versions of cmp_data[0] 206 are not shown in this view, for the sake of simplicity). A comparison of cmp_data[0] 206 with bit[0] may be viewed as being implemented by a multiplexor (mux) 210 which selects the true value of bit[0], i.e., b1 202 if cmp_data[0] 206 is "1" and the complement b1_1 204 if cmp_data[0] is "0" (in more detail: if the value of cmp_data[0] 206 is "1" then b1 202 corresponding to the "1" input of mux 210 will be selected as the output of mux 210, i.e., match 201, wherein, if b1 202 is "0", then there is a mismatch (since cmp_data[0] 206 is "1") and therefore match 201 will be generated as logic "0", but if b1 202 is "1", then there is a match and therefore match 201 will be generated as logic "1". On the other hand, if the value of cmp_data[0] 206 is logic "0", b1_1 204, corresponding to the "0" input of mux 210 will selected as match 201, wherein if the value of b1_1 204 is logic "1", then there is a match (since cmp_data[0] 206 is "0") and therefore match 201, will be logic "1", but if b1_1 304 is logic "0", then there is a mismatch and therefore match 201 will be logic "0"). Viewed another way circuit 200 can be viewed as implementing an XOR function of cmp_data[0] 206 and bit[0] to generate match 201, wherein match 201 is high if cmp_data[0] 206 matches bit[0]; otherwise, there is a mismatch and match 201 is low.

Figure 2B:
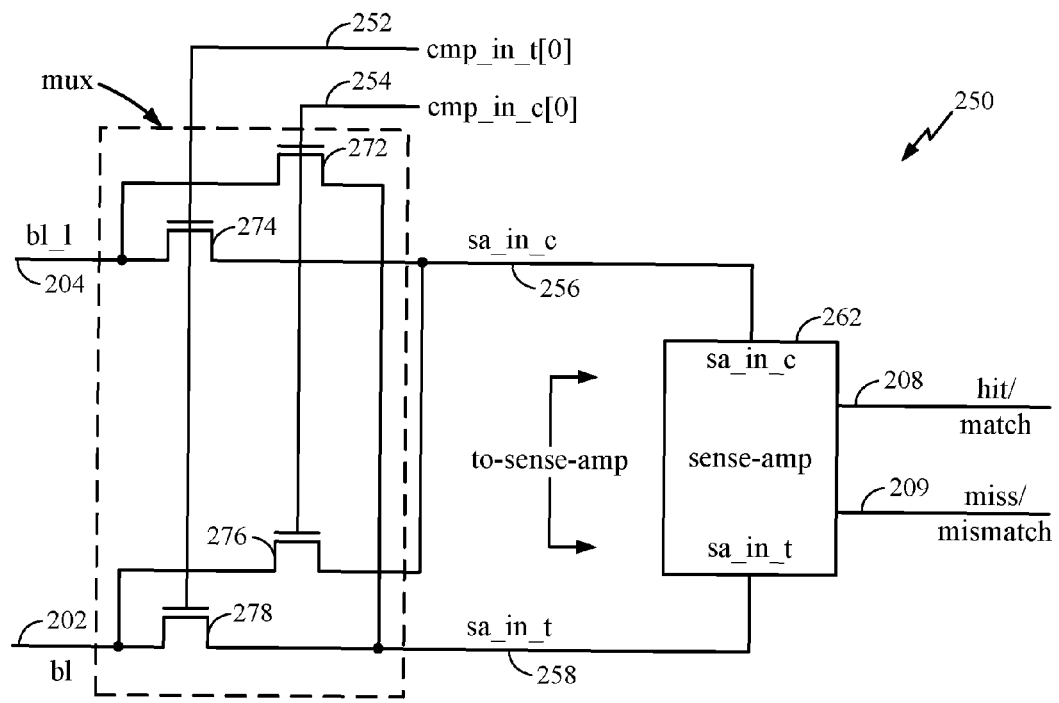

With the above functionality of circuit 200 in mind, compare circuit 250 for implementing an exemplary single-bit compare operation will now be discussed with reference to FIG. 2B. In FIG. 2B, true and complement versions of a search bit (e.g., cmp_data[0] 206) i.e., cmp_in_t[0] 252 and cmp_in_c[0] 254 are received as inputs to compare circuit 250. Once again, true and complement versions of bit[0], i.e., b1 202 and b1_1 204 are also received as inputs. The functionality of mux 210 of FIG. 2A may be implemented using pass transistors 272 and 274, 276, and 278 in FIG. 2B.

In more detail, if cmp_in_t[0] 252 is high or logic "1" (i.e., the complement cmp_in_c[0] 254 is low or logic "0"), then pass transistors 278 and 274 are turned on to provide b1 202 and b1_1 204 as true and complement inputs sa_in_t 258 and sa_in_c 256, respectively, to sense amplifier 262 (while pass transistors 272 and 276 are turned off). Thus, if b1 202 is also high in this case, there is a match and sa_in_t 258 is "1", which causes sense amplifier 262 to generate hit (or match) 208 as being "1" (or miss/mismatch 309 as being "0"). Either one of the signals hit 208 or miss 209 may be used as a single-ended output of sense amplifier 262 for aggregating match results of remaining n−1 bits of the data word depending on particular implementations chosen (as will be explained with reference to FIGS. 3A-B). Similarly, if b1 202 is low or "0", there is a mismatch and sa_in_c 256 is "1", which causes sense amplifier 262 to generate miss 209 as being "1" or hit 208 being "0".

On the other hand, if cmp_in_t[0] 252 is low or logic "0", i.e., the complement cmp_in_c[0] 254 is high or logic "1", then pass transistors 274 and 278 will be turned off, and pass transistors 276 and 272 will be turned on to provide b1 202 and b1_1 204 as inputs sa_in_c 256 and sa_in_t 258, respectively to sense amplifier 262 (the opposite or "swizzled connection" of the case when cmp_in_t[0] is "1", as described above). Correspondingly, if b1 202 is "1", there is a mismatch and sa_in_c 256 is "1", causing sense amplifier 262 to generate miss 209 as "1" or hit 208 as "0"; and if b1 202 is low or "0", there is a match and sa_in_t 358 is "1", causing sense amplifier 262 to generate hit 208 as "1" or miss 209 as "0"

Figure 3A:
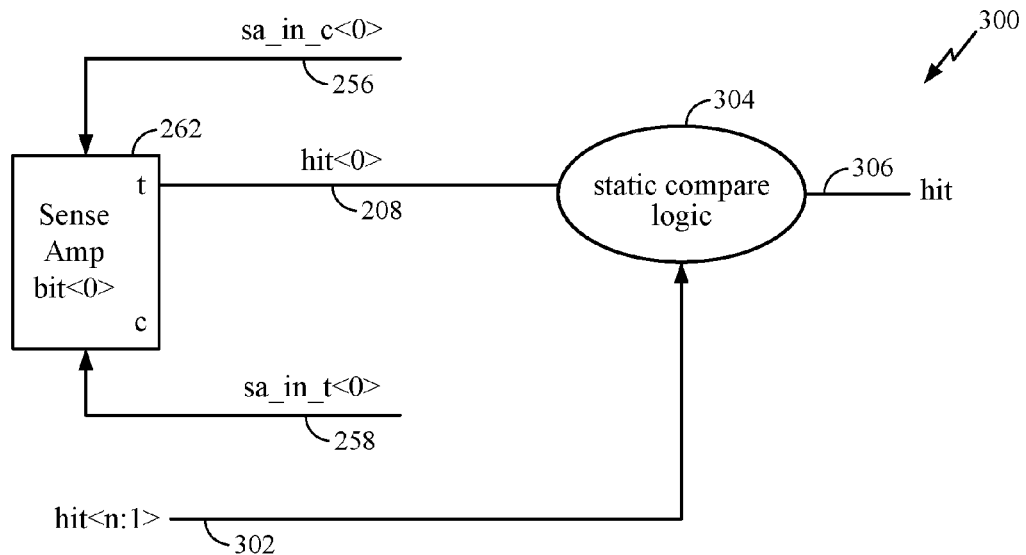
FIGS. 3A-B illustrate implementations of multi-bit compare circuits according to exemplary aspects of this disclosure.
Figure 3B:
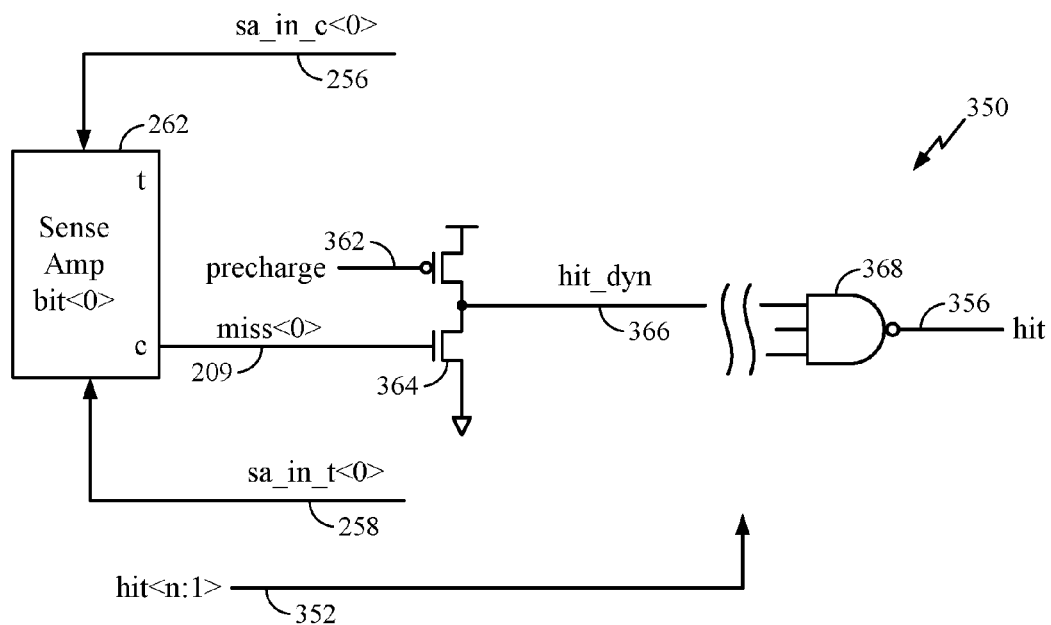

With reference now to FIGS. 3A-B, implementations of multi-bit compare operations using compare circuit 250 of FIG. 2B, for example, are shown. Referring first to FIG. 3A, compare circuit 300 is shown, which may be used, for example, in determining whether a data row stored in an indexed location of a memory array (not shown) has a bitwise match with a search word. For example, compare circuit 300 may be used for comparing if there is a bitwise match for n-bits of the search word with n-bits of the row. Considering that bit[0] (with true and complement signals b1 202 and b1_1 204) discussed with reference to FIGS. 2A-B is one of the n-bits of the data row, and cmp_in_t[0] 252 and cmp_in_c[0] 254 are true and complement versions of a corresponding search bit (e.g., cmp_data[0] 206) of the n-bit search word, inputs sa_in_t 258 and sa_in_c 256 are provided to sense amplifier 262 as discussed with reference to FIG. 2B. Single-ended output hit 208 is shown as generated by sense amplifier 262, similar to FIG. 2B, and is designated as hit[0] in FIG. 3A to correspond to a match indication between data[0] and the corresponding bit of the search word.

Similarly, single-ended outputs of the bitwise comparisons for the remaining n−1 bits may be provided on the bus illustrated as hit[n:1] 302. All the hit signals for the n-bits may then be aggregated in static compare logic 304 (e.g., implemented using a static logic gate such as an n-bit AND gate) to generate an overall hit 306 for the search operation on the entire data word comprising n-bits.

With reference now to FIG. 3B, another implementation of multi-bit compare operations using compare circuit 250 of FIG. 2B, for example, are shown with reference to compare circuit 350. Similar to compare circuit 300 of FIG. 3A, compare circuit 350 of FIG. 3B is also configured to generate the result of comparing bit[0] and cmp_data[0] 206 (see FIG. 2A) at the output of sense amplifier 262. More specifically, inputs sa_in_t 258 and sa_in_c 256 are once again provided to sense amplifier 262 as discussed with reference to FIG. 2B, and in this case, the single-ended output, miss 209, is used in the design, and is designated as miss[0] 209. As shown in this case, miss[0] 256 may be provided to the single level pull-down transistor shown as NFET 364 coupled between the dynamic hit signal, hit_dynamic 366 and ground. Hit_dynamic 366 may be initially precharged via the precharge transistor 362 which is precharged during a precharge phase. Once the precharge phase is complete, if miss[0] 209 is high, then hit_dynamic 366 may be pulled low, to indicate a mismatch for the comparison; otherwise, hit_dynamic 366 may remain high to indicate a match. Similar match indications from the remaining n−1 bits may be provided by the bus, hit[n:1] 352, and all n match results from outputs of a plurality of single level pull-down transistors may be aggregated or merged in NAND gate 368 to provide hit 356 which is a hit/miss indication for the entire data row of n-bits compared with the n-bit search word. It will be understood that although an n-input NAND gate 368, as shown, may be used in some implementations to merge the match results, in some implementations, it is also possible to merge the match results by performing dot operations on two or more of the n match results of bitwise compare operations on one or more signals such as hit_dynamic 366 (e.g., by using two or more NFET gates similar to NFET 364 for pulling down hit_dynamic 366 for corresponding mismatch indications of two or more bitwise compares).

As can be seen, the multi-bit search operation in circuits 300 and 350 of FIGS. 3A-B can be implemented with a reduced number of stages, and correspondingly, improved latency. In a first stage, the comparison of each search bit with the corresponding data bit is determined and provided at the output of a sense amplifier, and in a second stage outputs from multiple sense amplifiers corresponding to multiple similar bitwise comparisons, is aggregated to provide a multi-bit search result. The aggregation can be performed using single-ended outputs from the multiple sense amplifiers, which results in reduced latency and cost.

Figure 4:
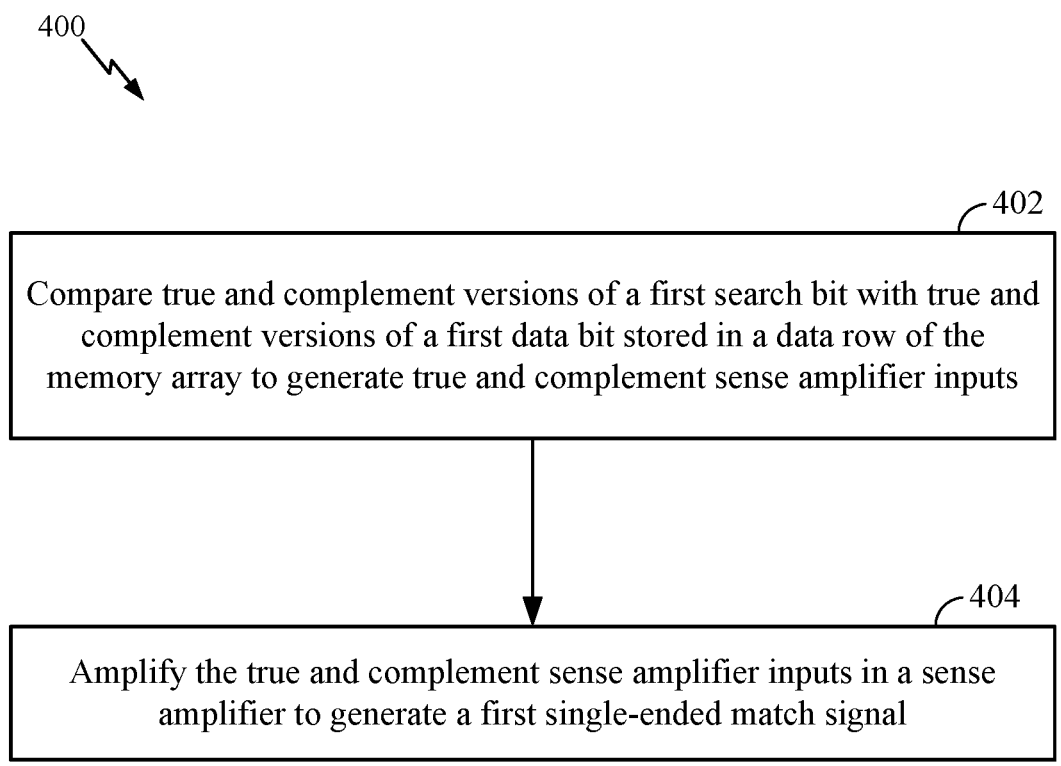
FIG. 4 illustrates a flow-chart pertaining to a method of performing memory operations according to exemplary aspects of this disclosure.

It will be appreciated that exemplary aspects include various methods for performing the processes, functions and/or algorithms disclosed herein. For example, as illustrated in FIG. 4, an exemplary aspect can include a method (400) of performing memory operations in a memory array, as discussed further below.

Block 402 can comprise comparing true and complement versions of a first search bit (e.g., cmp_in_t[0] 252 and cmp_in_c[0] 254, respectively) with true and complement versions of a first data bit (e.g., b1 202 and b1_1 204, respectively) stored in a data row of the memory array to generate true and complement sense amplifier inputs (e.g., sa_in_t 258 and sa_in_c 256).

Block 404 can comprise amplifying the true and complement sense amplifier inputs in a sense amplifier (e.g., sense amplifier 262) to generate a first single-ended match signal (e.g., hit 208 or miss 209).

Figure 5:
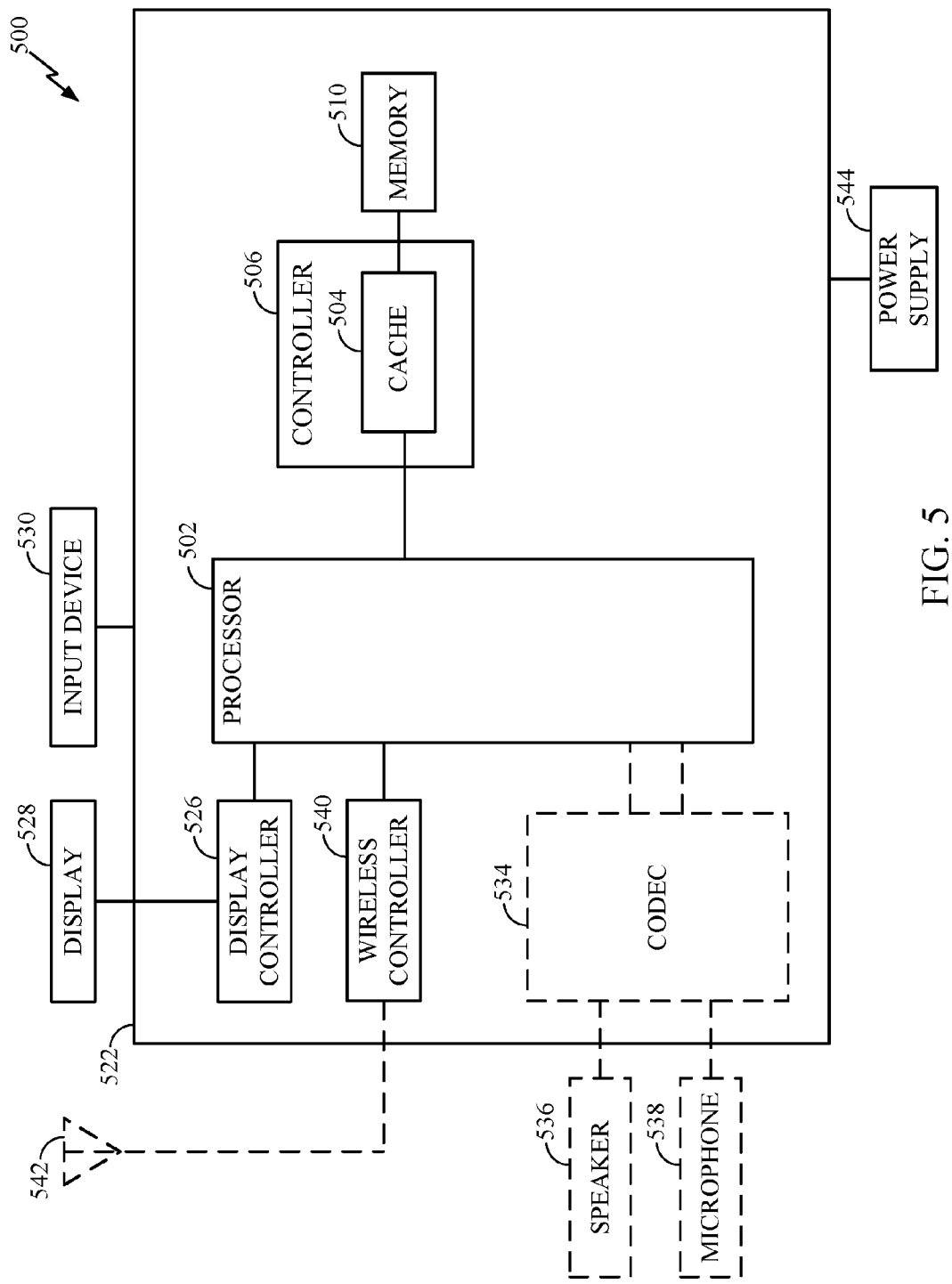
FIG. 5 depicts an exemplary computing device in which an aspect of the disclosure may be advantageously employed.

An example apparatus in which exemplary aspects of this disclosure may be utilized, will now be discussed in relation to FIG. 5. FIG. 5 shows a block diagram of computing device 500. Aspects of computing device 500 may be configured to perform method 400 of FIG. 4. In the depiction of FIG. 4, computing device 500 is shown to include processor 502, cache 504, cache controller 506, and memory 510. Cache 504 may comprise a SRAM memory as discussed above, comprising data rows to be searched and cache controller 506 may include the multi-bit comparison circuit 300 or 350 configured according to exemplary aspects for determining whether a data row at an indexed location of cache 504 has a bitwise match with a search word. In FIG. 5, processor 502 is exemplarily shown to be coupled to memory 510 with one level of cache 504 between them, but it will be understood that other memory configurations known in the art may also be supported by computing device 500.

FIG. 5 also shows display controller 526 that is coupled to processor 502 and to display 528. In some cases, computing device 500 may be used for wireless communication and FIG. 5 also shows optional blocks in dashed lines, such as coder/decoder (CODEC) 534 (e.g., an audio and/or voice CODEC) coupled to processor 502 and speaker 536 and microphone 538 coupled to CODEC 534; and wireless antenna 542 coupled to wireless controller 540 which is coupled to processor 502. Where one or more of these optional blocks are present, in a particular aspect, processor 502, display controller 526, cache 504, cache controller 506, memory 510, and wireless controller 540 are included in a system-in-package or system-on-chip device 522.

Accordingly, a particular aspect, input device 530 and power supply 544 are coupled to the system-on-chip device 522. Moreover, in a particular aspect, as illustrated in FIG. 5, where one or more optional blocks are present, display 528, input device 530, speaker 536, microphone 538, wireless antenna 542, and power supply 544 are external to the system-on-chip device 522. However, each of display 528, input device 530, speaker 536, microphone 538, wireless antenna 542, and power supply 544 can be coupled to a component of the system-on-chip device 522, such as an interface or a controller.

It should be noted that although FIG. 5 generally depicts a computing device, processor 502 and memory 510, may also be integrated into a set top box, a music player, a video player, an entertainment unit, a navigation device, a personal digital assistant (PDA), a fixed location data unit, a computer, a laptop, a tablet, a communications device, a mobile phone, a server, or other similar devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for performing memory operations according to aspects of this disclosure. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of performing memory operations in a memory array, the method comprising:
   comparing true and complement versions of a first search bit with true and complement versions of a first data bit stored in a data row of the memory array to generate true and complement sense amplifier inputs; and
   amplifying the true and complement sense amplifier inputs in a sense amplifier to generate a first single-ended match signal.

2. The method of claim 1, further comprising aggregating the first single-ended match signal with two or more other single-ended match signals from comparing two or more search bits with two or more data bits in the data row to generate a hit or miss indication for the data row.

3. The method of claim 2, comprising performing the step of aggregating in a static logic gate.

4. The method of claim 2, comprising performing the step of aggregating by coupling the first single-ended match signal and the two or more other single-ended match signals to a plurality of single level pull-down transistors, generating dynamic hit signals from outputs of the plurality of single level pull-down transistors, and aggregating the dynamic hit signals.

5. The method of claim 1, comprising performing the step of comparing using an XOR function of logic values of the first search bit with true and the first data bit.

6. An apparatus comprising:
   logic configured to compare true and complement versions of a first search bit with true and complement versions of a first data bit stored in a data row of a memory array to generate true and complement sense amplifier inputs; and
   a sense amplifier configured to amplify the true and complement sense amplifier inputs to generate a first single-ended match signal.

7. The apparatus of claim 6, further comprising aggregation logic configured to aggregate the first single-ended match signal with two or more other single-ended match signals from comparisons of two or more search bits with two or more data bits in the data row, to generate a hit or miss indication for the data row.

8. The apparatus of claim 7, wherein the aggregation logic comprises a static logic gate.

9. The apparatus of claim 7, comprising a plurality of single level pull-down transistors coupled to the first single-ended match signal and the two or more other single-ended match signals and configured to generate dynamic hit signals, wherein the aggregation logic is configured to aggregate outputs of the plurality of single level pull-down transistors.

10. The apparatus of claim 6, wherein the logic comprises XOR logic configured to perform an XOR function of logic values of the first search bit with true and the first data bit.

11. The apparatus of claim 6, integrated into a device selected from the group consisting of a set top box, a music player, a video player, an entertainment unit, a navigation device, a personal digital assistant (PDA), a fixed location data unit, a computer, a laptop, a tablet, a communications device, a server, and a mobile phone.

12. An apparatus comprising:
   means for comparing true and complement versions of a first search bit with true and complement versions of a first data bit stored in a data row of a memory array to generate true and complement inputs; and
   means for amplifying the true and complement inputs for generating a first single-ended match signal.

13. The apparatus of claim 12, further comprising means for aggregating the first single-ended match signal with two or more other single-ended match signals from comparisons of two or more search bits with two or more data bits in the data row, for generate a hit or miss indication for the data row.

14. The apparatus of claim 13, wherein the means for aggregating comprises static logic gates.

15. The apparatus of claim 13, wherein the means for aggregating comprises dynamic logic gates.

16. The apparatus of claim 12, wherein the means for comparing comprises means for performing an XOR function of logic values of the first search bit with true and the first data bit.

17. The apparatus of claim 12, integrated into a device selected from the group consisting of a set top box, a music player, a video player, an entertainment unit, a navigation device, a personal digital assistant (PDA), a fixed location data unit, a computer, a laptop, a tablet, a communications device, a server, and a mobile phone.

* * * * *